United States Patent [19]

Hayward et al.

[11] Patent Number: 4,737,744
[45] Date of Patent: Apr. 12, 1988

[54] INTEGRATED CAPACITORS FOR FORMING COMPONENTS OF BANDPASS FILTERS

[75] Inventors: Wesley H. Hayward, Beaverton; Stephen H. Skidmore, Portland; Keith E. Jones, Aloha, all of Oreg.

[73] Assignee: Tektronix, Inc., Beaverton, Oreg.

[21] Appl. No.: 831,683

[22] Filed: Feb. 21, 1986

[51] Int. Cl.⁴ .......................................... H03H 7/075
[52] U.S. Cl. .................... 333/168; 333/175; 333/185; 361/328; 361/329; 361/303
[58] Field of Search ............... 333/202, 204, 205, 207, 333/212, 246, 185, 175, 168; 361/303, 306, 308, 309, 310, 312, 328–330, 402; 334/41, 45

[56] References Cited

U.S. PATENT DOCUMENTS

| 2,753,530 | 7/1956 | Horvath | 333/205 X |
| 3,506,936 | 4/1970 | Loos et al. | 361/302 X |
| 3,805,198 | 4/1974 | Gewartowski et al. | 333/204 |
| 4,161,766 | 7/1979 | Castleberry et al. | 361/330 X |
| 4,276,525 | 6/1981 | Nishikawa et al. | 333/206 |
| 4,380,040 | 4/1983 | Posset | 361/278 X |
| 4,476,518 | 10/1984 | Tsukahara | 361/328 |
| 4,573,101 | 2/1986 | Takeno | 361/328 X |
| 4,622,528 | 11/1986 | Milord | 333/205 |

OTHER PUBLICATIONS

Boutrous, Kamal S.; "A New Approach to the Design of EMI Filter Connectors Using Planar Filters"; 12th *Annual Connector Symposium Proceedings*; Cherry Hill, N.J., Oct. 17–18, 1979; pp. 222–226.

Primary Examiner—Eugene R. LaRoche
Assistant Examiner—Benny Lee
Attorney, Agent, or Firm—Francis I. Gray

[57] ABSTRACT

Integrated capacitors provide more than one capacitor on a single dielectric substrate. A dielectric substrate has a conductive backplane on one side and two or more conductive capacitor plates on the opposite side. The integrated capacitors may be mounted on a shield wall which has a through hole so that one capacitor is connected to the shield wall and another forms a coupling capacitor via the hole between two stages on opposite sides of the shield wall.

3 Claims, 1 Drawing Sheet

INTEGRATED CAPACITORS FOR FORMING COMPONENTS OF BANDPASS FILTERS

BACKGROUND OF THE INVENTION

The present invention relates to integrated components, and more particularly to integrated capacitors having low values and high Q which are suitable for bandpass filters.

There are many electronic devices which require bandpass filters. These filters may be cascaded together and coupled one to the other by coupling capacitors. These circuits generally are built with discrete components, especially where resonant frequency filters are concerned. These circuits have a coil, fixed capacitor and variable, or tuning, capacitor connected in parallel, with each stage coupled to the next by a coupling capacitor. At frequencies in the range of one hundred megahertz the value of this coupling capacitor is required to be small, on the order of tenths of picofarads. With discrete components it is difficult to reliably get capacitors of very small value with high Q, and these components have an impact on the frequency performance of the circuit due to lead lengths and position.

Therefore, it is desired to have for use in bandpass filters integrated capacitors of very small value which have a high Q without the frequency sensitivity demonstrated by discrete components.

SUMMARY OF THE INVENTION

Accordingly, the present invention provides integrated capacitors for a resonant bandpass filter which have very small values and high Q. The integrated capacitors are formed by placing conductive material on both sides of a substrate having a high dielectric constant. The conductive material on one side of the substrate is etched away to form a plurality of electrodes which produces a plurality of capacitors on a single substrate. The integrated capacitors so formed are mounted on a metallic shield which separates the stages of a resonant bandpass filter The shield has a hole through which a lead is connected to one of the capacitors of the integrated capacitors. Another capacitor of the integrated capacitors is connected to the shield.

The objects, advantages and novel features of the present invention will be apparent when the following detailed description is read in view of the appended claims and attached drawing.

DESCRIPTION OF THE PREFERRED EMBODIMENT

Figure 1:
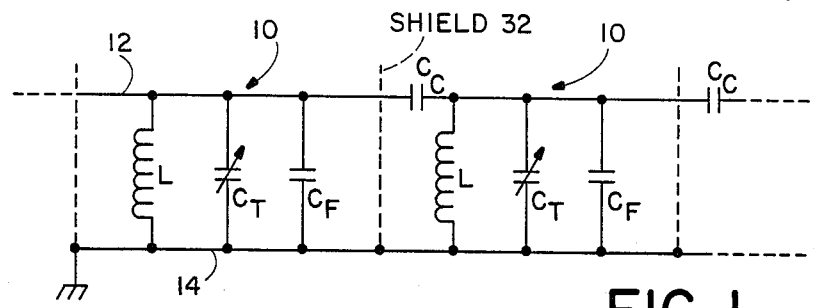
FIG. 1 is a circuit schematic for a multi-stage resonant bandpass filter.

Referring now to FIG. 1 a resonant band pass filter is shown having a plurality of stages 10. Each stage 10 has an inductor L, a tuning capacitor $C_t$ and a fixed capacitor $C_f$ connected in parallel between a signal line 12 and a ground plane 14. Each stage 10 is connected to the succeeding stage by a series coupling capacitor $C_c$ which is required to have a very small value, on the order of 0.4 picofarads. The electrical components which make up each stage 10 and coupling capacitor $C_c$ are usually discrete components. However, the resonator portion may be of the transmission line, dielectric or crystal types in lieu of discrete components.

Figure 2:
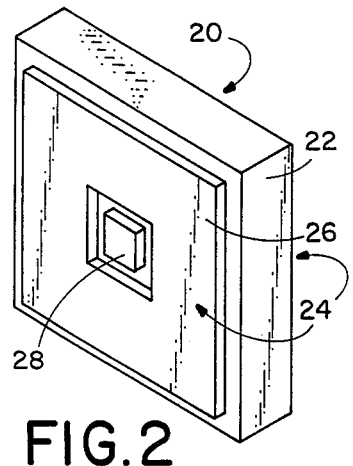
FIG. 2 is a perspective view of integrated capacitors according to the present invention.

Integrated capacitors 20, such as shown in FIG. 2, are formed by plating both sides of a substrate 22 with a thin film of conductive material 24. The conductive material 24 on one side of the substrate 22 is etched away to form separate plates, 26 and 28, of the integrated capacitors 20. The substrate 20 may be of any non-conductive material having a good dielectric constant, but preferably is a ceramic substrate, such as alumina, which has a high dielectric constant to minimize size. The conductive material 24 may be any conductive metal, such as gold or copper, and may be applied to the substrate 22 using thin film techniques, thick film screening processes, copper cladding techniques with etchback, or the like. The value of capacitance for integrated capacitors 20 may be kept within tight tolerances using these techniques, and may be very small.

Figure 3:
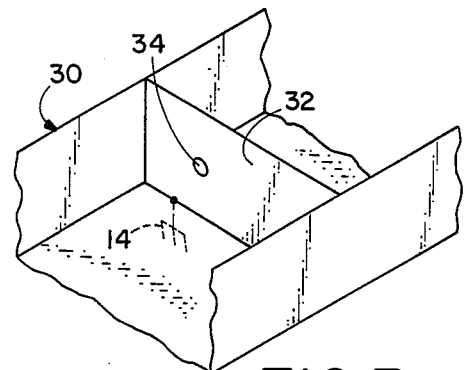
FIG. 3 is a perspective view of a part of a housing for the resonant bandpass filter of FIG. 1.

Electrical circuits are generally placed in a conductive housing 30, a portion of one being shown in FIG. 3. To provide a surface upon which to mount the integrated capacitors 20, and to provide electromagnetic interference isolation between stages 10, a shield wall 32 is formed integrally with the housing 30 to compartmentalize the housing. A hole 34 is provided through the shield wall 32 so that leads may connect the stages 10 to each other.

Figure 4:
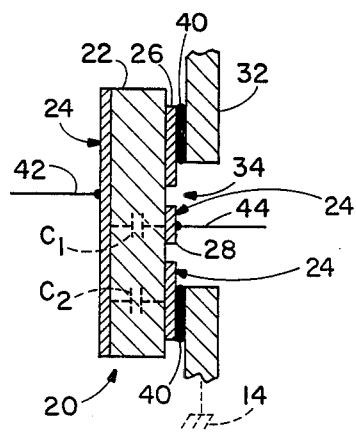
FIG. 4 is a cross-sectional view of the integrated capacitors mounted in the housing of FIG. 3.
Figure 5:
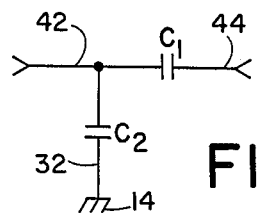
FIG. 5 is an equivalent circuit schematic for the integrated capacitors as mounted in FIG. 4.

As shown in FIG. 4 the integrated capacitors 20 are mounted on the shield wall 32 by any suitable means which provides a low impedance electrical contact, such as solder 40, so that one capacitor plate 26 makes electrical contact with the shield wall and the other capacitor plate 28 is located in the center of the hole 34. The capacitor $C_2$, formed by the one plate 26 and the metallization 24 on the opposite side of the substrate 22, is connected between the ground plane 14 and an input lead wire 42, as shown schematically in FIG. 5. The capacitor $C_1$, formed by the second plate 28 and the backplane metallization 24, is connected in series between the input lead wire 42 and an output lead wire 44 via the hole 34. The leads may be attached to the conducting material 24 of the integrated capacitors 20 by suitable means, such as point welding. The resulting configuration can be used in the circuit of FIG. 1 to replace the fixed capacitor $C_f$ and the coupling capacitor $C_c$ with the integrated capacitors 20 mounted on the shield wall 32.

Thus, the present invention provides integrated capacitors on a single substrate which have a high Q and very small value suitable for frequencies from audio to low microwave, and which have a topology that allows attachment to a flat metal surface.

What is claimed is:

1. Integrated capacitors for coupling resonant stages comprising:
    a dielectric substrate having a first and a second face, the first and second faces being parallel to each other;
    a conductive backplane attached to the first face of the dielectric substrate; and
    a plurality of concentric conductive capacitor plates attached to the second face of the dielectric substrate to form a plurality of capacitors on the dielectric substrate suitable for mounting on a flat metallic surface, the integrated capacitor formed by the innermost conductive capacitor plate and the conductive backplane being a coupling capacitor and having a value much less than the value of the integrated capacitor formed by the outermost conductive capacitor plate and the conductive backplane.

2. An improved bandpass filter having a plurality of stages contained in a housing, each stage having a resonator with a resonator component and a coupling capacitor between stages, the improvement comprising:

an associated shield wall mounted within the housing between each stage, each shield wall having a hole therethrough between stages; and a plurality of capacitors, integrated on a single dielectric substrate, for each shield wall, the integrated capacitors being attached to the associated shield wall such that one of the capacitors is the coupling capacitor to connect adjacent stages via the hole in the shield wall and another of the capacitors is the resonator component for one of the stages being connected together.

3. An improved bandpass filter as recited in claim 2 wherein the integrated capacitors comprise:

a conductive backplane attached to one side of the dielectric substrate; and a plurality of conductive capacitor plates attached to the other side of the dielectric substrate, one of the conductive capacitor plates in conjunction with the back plane forming the coupling capacitor.

* * * * *